US008373446B2

United States Patent
Manohar et al.

(10) Patent No.: US 8,373,446 B2
(45) Date of Patent: Feb. 12, 2013

(54) POWER SUPPLY DETECTION CIRCUIT

(75) Inventors: Sujan Kundapur Manohar, Kundapur (IN); Arvind Madan, Bangalore (IN); Shahid Ali, New Delhi (IN)

(73) Assignee: Texas Instruments Incorporated, Dallas, TX (US)

(*) Notice: Subject to any disclaimer, the term of this patent is extended or adjusted under 35 U.S.C. 154(b) by 204 days.

(21) Appl. No.: 12/979,388

(22) Filed: Dec. 28, 2010

(65) Prior Publication Data
US 2012/0161745 A1 Jun. 28, 2012

(51) Int. Cl.
*H03K 5/153* (2006.01)
(52) U.S. Cl. .................... 327/77; 327/143
(58) Field of Classification Search ............. 327/77–81, 327/142, 143
See application file for complete search history.

(56) References Cited

U.S. PATENT DOCUMENTS

| 6,215,342 | B1 * | 4/2001 | Morrill ........................ 327/143 |
| 6,636,089 | B2 * | 10/2003 | Majcherczak et al. ........ 327/143 |
| 6,744,291 | B2 * | 6/2004 | Payne et al. .................. 327/143 |
| 7,034,585 | B1 * | 4/2006 | Kiani ............................ 327/143 |
| 7,119,578 | B2 * | 10/2006 | Correale et al. ............... 326/81 |
| 2009/0302903 | A1 * | 12/2009 | Woo ............................. 327/143 |

\* cited by examiner

*Primary Examiner* — Quan Tra
(74) *Attorney, Agent, or Firm* — John R. Pessetto; W. James Brady; Frederick J. Telecky, Jr.

(57) ABSTRACT

Power supply detection circuit. The power supply detection circuit includes an input circuit responsive to a core power supply voltage to generate a first output voltage at a first node. The power supply detection circuit also includes a sense logic circuit to sense a voltage drop associated with the first output voltage, when the first output voltage is at a logic level HIGH. Further, the power supply detection circuit includes a current mirror circuit responsive to the voltage drop to increase voltage of the first output voltage to an input and output power supply voltage. Moreover, the power supply detection circuit also includes an output circuit that inverts the first output voltage to generate a second output voltage at a second node.

4 Claims, 4 Drawing Sheets

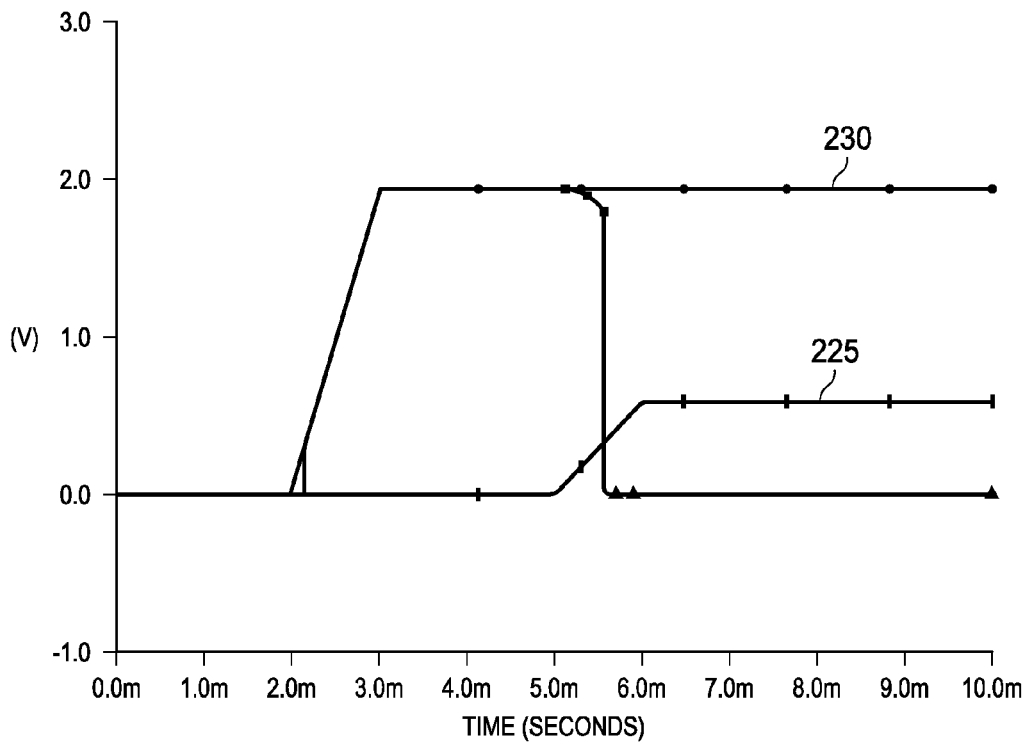
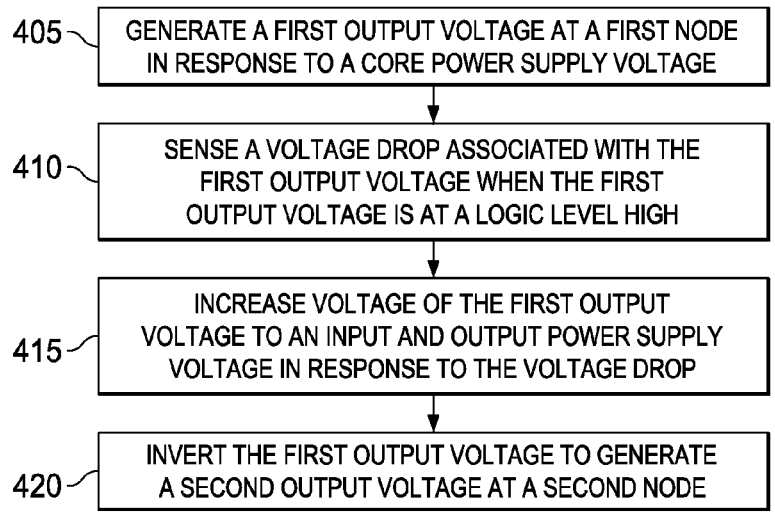

POWER SUPPLY DETECTION CIRCUIT

TECHNICAL FIELD

Embodiments of the disclosure relate to power supply detection circuits.

BACKGROUND

Typically, an integrated circuit is supplied with a core power supply voltage (VDDC) intended for a core logic circuit of the integrated circuit and an input and output power supply voltage (VDDIO) intended for input and output (IO) circuits in the integrated circuit. VDDC is usually lesser than VDDIO. In an existing scenario, it is desired that the integrated circuit saves power and hence the integrated circuit is operated at a low VDDC. Further, VDDC is inactivated in certain portions of the core logic circuit in a sleep mode, and activated in a wake-up mode. However, there can be short circuit power dissipation at output drivers of the IO circuits when VDDC is inactivated. The short circuit power dissipation at the output drivers can also occur during power up of the integrated circuit when VDDIO is provided before VDDC. Further, the IO circuit needs to be operated at different VDDIOs during different modes of operation, for example at 1.2V and at 1.8V, to optimize power and performance. Hence, there is a need for a power supply detection circuit that detects presence of core and IO power supply voltages used by the integrated circuit. There is also a need to ensure protection of the IO circuits and minimize power dissipation.

SUMMARY

An example of a power supply detection circuit includes an input circuit responsive to a core power supply voltage to generate a first output voltage at a first node. The power supply detection circuit also includes a sense logic circuit to sense a voltage drop associated with the first output voltage, when the first output voltage is at a logic level HIGH. Further, the power supply detection circuit includes a current mirror circuit responsive to the voltage drop to increase voltage of the first output voltage to an input and output power supply voltage. Moreover, the power supply detection circuit includes an output circuit that inverts the first output voltage to generate a second output voltage at a second node.

An example of an integrated circuit includes a core logic circuit that receives a core power supply voltage and an input and output power supply voltage from a power supply circuit. The core logic circuit is responsive to the core power supply voltage to generate an output. The integrated circuit also includes a power supply detection circuit coupled to the core logic circuit. The power supply detection circuit includes an input circuit, a sense logic circuit, a current minor circuit, and an output circuit. The input circuit is responsive to the core power supply voltage to generate a first output voltage at a first node. The sense logic circuit senses a voltage drop associated with the first output voltage, when the first output voltage is at a logic level HIGH. The current mirror circuit is responsive to the voltage drop to increase voltage of the first output voltage to the input and output power supply voltage. The output circuit inverts the first output voltage to generate a second output voltage at a second node. Moreover, the integrated circuit includes an input and output circuit coupled to the core logic circuit and the power detection circuit. The input and output circuit is responsive to both the output and the second output voltage to minimize power dissipation.

An example of a method of detecting power supply includes generating a first output voltage at a first node in response to a core power supply voltage. The method also includes sensing a voltage drop associated with the first output voltage when the first output voltage is at a logic level HIGH. The method further includes increasing voltage of the first output voltage to an input and output power supply voltage in response to the voltage drop. Moreover, the method includes inverting the first output voltage to generate a second output voltage at a second node.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the invention.

FIGS. 2A-2C are exemplarily representations illustrating different power-up scenarios with respect to time, in accordance with one embodiment;

FIG. 4 is a flow diagram illustrating a method of detecting power supply, in accordance with one embodiment.

DETAILED DESCRIPTION OF THE EMBODIMENTS

An integrated circuit includes, but is not limited to, a core logic circuit, an input and output (IO) circuit, and a power supply detection circuit. A power supply circuit, external to the integrated circuit, is coupled to the integrated circuit to supply a core power supply voltage (VDDC) to the core logic circuit and to the power supply detection circuit in order to power up the integrated circuit. The power supply circuit also supplies an IO power supply voltage (VDDIO) to the IO circuit. The core logic circuit performs logical operations and provides an output to the IO circuit. The power supply detection circuit detects the VDDC provided to the core logic circuit and provides another output to the IO circuit. The IO circuit buffers the output to drive a load. The IO circuit is also responsible for information transfer with peripheral devices.

Figure 1:
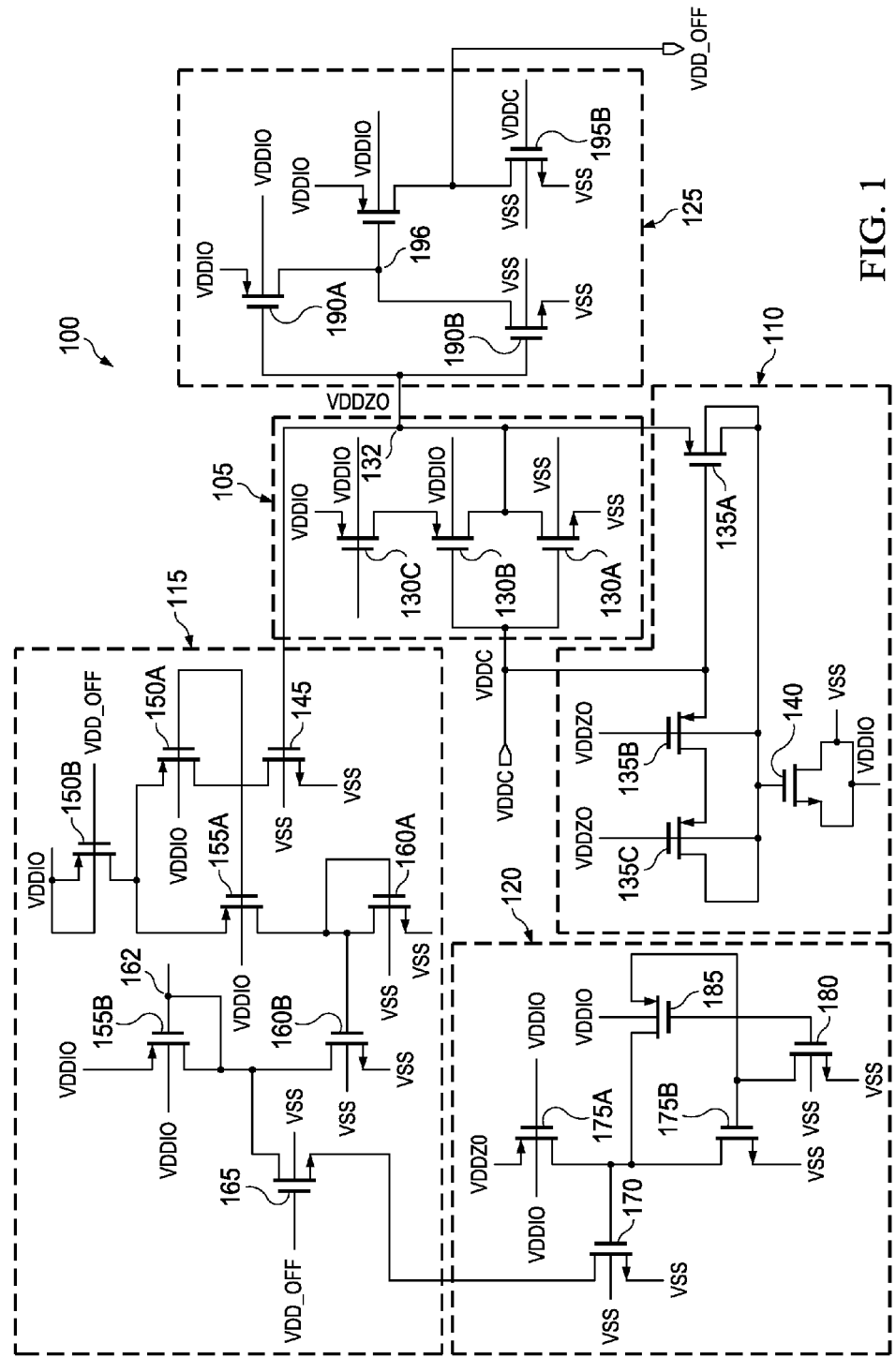
FIG. 1 illustrates a power supply detection circuit, in accordance with one embodiment.

FIG. 1 illustrates a power supply detection circuit 100, hereinafter referred to as the circuit 100. The circuit 100 can be included in an integrated circuit and can be coupled between a core logic circuit and an input and output (IO) circuit of the integrated circuit. The IO circuit can also include a plurality of level shifters and a plurality of IO drivers.

It is noted that the circuit 100 can be used in various other application areas where it is desired to detect activation and inactivation of a power supply.

The circuit 100 includes an input circuit 105, a circuit 110, a current mirror circuit 115, a sense logic circuit 120, and an output circuit 125.

The input circuit 105 includes a plurality of transistors, for example a negative metal oxide semiconductor (NMOS) type transistor 130A, a positive metal oxide semiconductor (PMOS) type transistor 130B (together form a first inverter), and a PMOS transistor 130C (a first PMOS). The NMOS transistor 130A has a drain coupled to a drain of the PMOS transistor 130B and a source coupled to a ground supply (VSS). The PMOS transistor 130C has a drain coupled to a source of the PMOS transistor 130B and a source coupled to an input and output (IO) power supply voltage (VDDIO). Gates of the NMOS transistor 130A and the PMOS transistor 130B receive a core power supply voltage (VDDC). A node 132 (first node) can be coupled between the drains of the NMOS transistor 130A and the PMOS transistor 130B.

The circuit 110 includes a PMOS transistor 135A (fourth PMOS transistor) a PMOS transistor 135B, a PMOS transistor 135C (together form a pair of PMOS transistors) and a metal oxide semiconductor (MOS) capacitor 140. The PMOS transistor 135A has a source coupled to the drain of the NMOS transistor 130A, a drain coupled to a first terminal of the MOS capacitor 140, and a gate coupled to a source of the PMOS transistor 135B. The PMOS transistor 135C has a source coupled to a drain of the PMOS transistor 135B and a drain coupled to the first terminal of the MOS capacitor 140. Gates of the PMOS transistor 135B and the PMOS transistor 135C receive a first output voltage (VDDZ0).

The current mirror circuit 115 includes an NMOS transistor 145 (second NMOS transistor), a PMOS transistor 150A, a PMOS transistor 150B, a PMOS transistor 155A, an NMOS transistor 160A, a PMOS transistor 155B, an NMOS transistor 160B, and an NMOS transistor 165 (a first NMOS transistor). The NMOS transistor 145 has a gate coupled to the drain of the NMOS transistor 160A. The PMOS transistor 150A has a drain coupled to a drain of the NMOS transistor 145 and a source coupled to a drain of the PMOS transistor 150B. The PMOS transistor 155A has a source coupled to the drain of the PMOS transistor 150B and a drain coupled to a drain of the NMOS transistor 160A. The NMOS transistor 160B has a gate coupled to the drain of the NMOS transistor 160A and a drain coupled to a drain of the PMOS transistor 155B. Sources of the PMOS transistor 150B and the PMOS transistor 155B receive VDDIO. The NMOS transistor 165 has a drain coupled to the drain of the PMOS transistor 155B.

The sense logic circuit 120 includes an NMOS transistor 170, a PMOS transistor 175A (second PMOS transistor), an NMOS transistor 175B, an NMOS transistor 180, and a PMOS transistor 185. The NMOS transistor 170 has a drain coupled to a source of the NMOS transistor 165 and a gate coupled to drains of the transistor PMOS 175A and the NMOS transistor 175B. The NMOS transistor 180 has a drain coupled to gates of the NMOS transistor 175B and the PMOS transistor 185. The PMOS transistor 185 has a drain coupled to the drain of the NMOS transistor 175B and a source coupled to the gate of the NMOS transistor 175B. Sources of the PMOS transistor 175A and the PMOS transistor 185 receive VDDIO.

The output circuit 125 includes a PMOS transistor 190A, an NMOS transistor 190B (together form a second inverter), a PMOS transistor 195A (third PMOS transistor), and an NMOS transistor 195B (third NMOS transistor). The PMOS transistor 190A and the NMOS transistor 190B, together forming an inverter, have gates coupled to the drain of the NMOS transistor 130A, and drains coupled to a gate of the PMOS transistor 195A. The PMOS transistor 195A has a drain coupled to a drain of the NMOS transistor 195B. Sources of the PMOS transistor 190A and the PMOS transistor 195A receive VDDIO. The PMOS transistor 195A and the NMOS transistor 195B can provide an output signal at a node 196 (second node) that is coupled between the drains of the PMOS transistor 195A and the NMOS transistor 195B.

The working of the circuit 100 is now explained in detail. The input circuit 105 is responsive to VDDC to generate VDDZ0 at the node 132. VDDZ0 is an inverted form of VDDC. VDDC at logic level LOW is an indication that the core logic circuit is inactivated or in sleep mode. VDDC at logic level HIGH is an indication that the core logic circuit is activated. When VDDC is at logic level LOW, the NMOS transistor 130A is rendered inactive whereas the PMOS transistor 130B is active. The NMOS transistor 130A is usually stronger than both the PMOS transistor 130B and the PMOS transistor 130C together. Value at the node 132 is held by the MOS capacitor 140, for example a 2 pico Farad (pF) capacitor, until the PMOS transistor 130C is activated. The current mirror circuit 115 is then activated to provide a regenerative feedback for the node 132 by pulling up VDDZ0 to VDDC.

In order to eliminate power dissipation due to static currents, the current minor circuit 115 is inactivated and a signal, associated with a node 162, is applied to gates of the PMOS transistor 130C and the PMOS transistor 155B. The signal follows VDDIO and hence inactivates the PMOS transistor 130C. The sense logic circuit 120 gets activated once output of the circuit 100 is at logic level HIGH and further senses a drop at the node 132. The node 132 can discharge due to noise or leakage which activates the PMOS transistor 130C and pulls up VDDZ0, at the node 132, to VDDIO. The sense logic circuit 120 gets inactivated once VDDZ0 reaches VDDIO. The VDDZ0 is then buffered to the node 196 using the output circuit 125 to provide VDD_OFF (second output voltage) at logic level HIGH. The VDDIO is then inactivated to eliminate the power dissipation at the IO circuit.

When VDDC is at logic level HIGH, the MOS capacitor 140 is charged to VDDC and VDDZ0 is pulled to logic level LOW. The current mirror circuit 115 and the sense logic circuit 120 are inactivated to prevent static current dissipation. VDDZ0 is then buffered to the node 196 using the output circuit 125 to provide VDD_OFF at logic level LOW. Signal propagation from the core logic circuit is then allowed as in a normal mode of operation. VDD_OFF at logic level LOW indicates that the core logic circuit is activated.

The working of the circuit 100 is further explained when VDDC transitions from logic level LOW to logic level HIGH. When VDDC is at logic level LOW, VDDZ0 is at VDDIO, at logic level HIGH. The PMOS transistor 135A is activated, thus enabling the MOS capacitor 140 to charge the node 132 to in turn activate the NMOS transistor 145. In one example, VDDC can also have a value as low as 0.6V. When VDDC rises, the NMOS transistor 130A is activated. As the NMOS transistor 130A is stronger than a combination of the PMOS transistor 130B and the PMOS transistor 130C, the NMOS transistor 130A pulls VDDZ0 towards logic level LOW. Once VDDZ0 becomes a particular value, the NMOS transistor 145, which is an input transistor of the current minor circuit 315, is inactivated. The node 162 is then pulled to logic level HIGH, which in turn inactivates the PMOS transistor 130C. A pull up path for the node 132 is closed and VDDZ0 then reaches logic level LOW. The logic level LOW of VDDZ0 at the node 132 is buffered and generated as the output signal (VDD_OFF) by the output circuit 125. The PMOS transistor 190A and the NMOS transistor 190B together form the inverter which inverts the logic level LOW of VDDZ0. The PMOS transistor 195A is coupled to output of the inverter and the NMOS transistor 195B receives VDDC at the gate. When VDDC goes to logic level HIGH, the logic level LOW of VDDZ0 is inverted by the inverter to a logic level HIGH. Hence, the PMOS transistor 195A is inactivated and the NMOS transistor 195B pulls VDD_OFF to logic level LOW. The logic level LOW at VDD_OFF indicates that the core logic circuit is in the sleep mode and activates the current mirror circuit 115 by activating the PMOS transistor 150B, and inactivates the sense logic circuit 120 by inactivating the NMOS transistor 165.

When VDDC is rising to logic level HIGH and VDDZ0 is falling to logic level LOW, VDDC approaches VDDZ0 at a particular voltage level. The PMOS transistor 135A is inactivated and the MOS capacitor 140 is charged to VDDC via the PMOS transistor 135B and the PMOS transistor 135C. The charging of the MOS capacitor 140 is performed in order to store sufficient charge for suitable functioning of the circuit 100 when VDDC transitions from logic level HIGH to logic level LOW.

The working of the circuit 100 is explained when VDDC transitions from logic level HIGH to logic level LOW. When VDDC is at logic level HIGH, both VDDZ0 and VDD_OFF are at logic level LOW and the MOS capacitor 140 is charged to VDDC. When VDDC falls to logic level LOW, the PMOS transistor 135A is slowly activated and the MOS capacitor 140 charges the node 132 towards VDDC, which partially inactivates the NMOS transistor 145 of the current mirror circuit 115. Once NMOS 145 is turned on, the gates of the PMOS transistor 150A and the PMOS transistor 155A are pulled low and become activated. Hence there is a current flowing in a first branch that includes the NMOS transistor 145 and the PMOS transistor 150A. The current in the first branch is mirrored and amplified in a second branch by a first current minor. The second branch includes the PMOS transistor 155A and the NMOS transistor 160A. The current in the second branch is further mirrored and amplified in a third branch by a second current mirror. The third branch includes the PMOS transistor 155B and the NMOS transistor 160B. The node 162 is then pulled low by the NMOS transistor 160B. The node 162 turns on the PMOS transistor 130C in the input circuit 105 and hence pulls the node 132 to logic level HIGH. VDDZ0 is then given to the inverters of the output circuit 125 to get VDD_OFF at logic level HIGH indicating that the core logic circuit is inactivated. The current minor circuit 315 is then inactivated by turning off PMOS transistor 150B, such that the static current dissipation is prevented. If VDDZ0 discharges below level of VDDIO, the sense logic circuit 120 is activated by activating the NMOS transistor 165.

In some embodiments, the node 132 at VDDZ0 can discharge due to noise, leakage in the MOS capacitor 140, or due to a noise at the input. A drop in VDDZ0 triggers the PMOS transistor 175A. A current gain is hence provided at the input of the current minor circuit 115 which ensures sufficient current is provided at the output of the current minor circuit 115. A preexisting logic level LOW provided at gate of the NMOS transistor 180, inactivates the NMOS transistor 180 and activates the PMOS transistor 185. A current flows through the PMOS transistor 185, activates the NMOS transistor 175B and takes a path through the NMOS transistor 175B. The NMOS transistor 175B, behaving as a diode, hence minors the current from the PMOS transistor 175A to flow through the NMOS transistor 170 and the NMOS transistor 165. The node 162 is pulled to logic level LOW thus turning on the PMOS transistor 130C. Once VDDZ0 reaches VDDIO at logic level HIGH, the PMOS transistor 175A is inactivated. The sense logic circuit 120 and the current minor circuit 115 are hence shut down to prevent the static current dissipation.

Figure 2A:
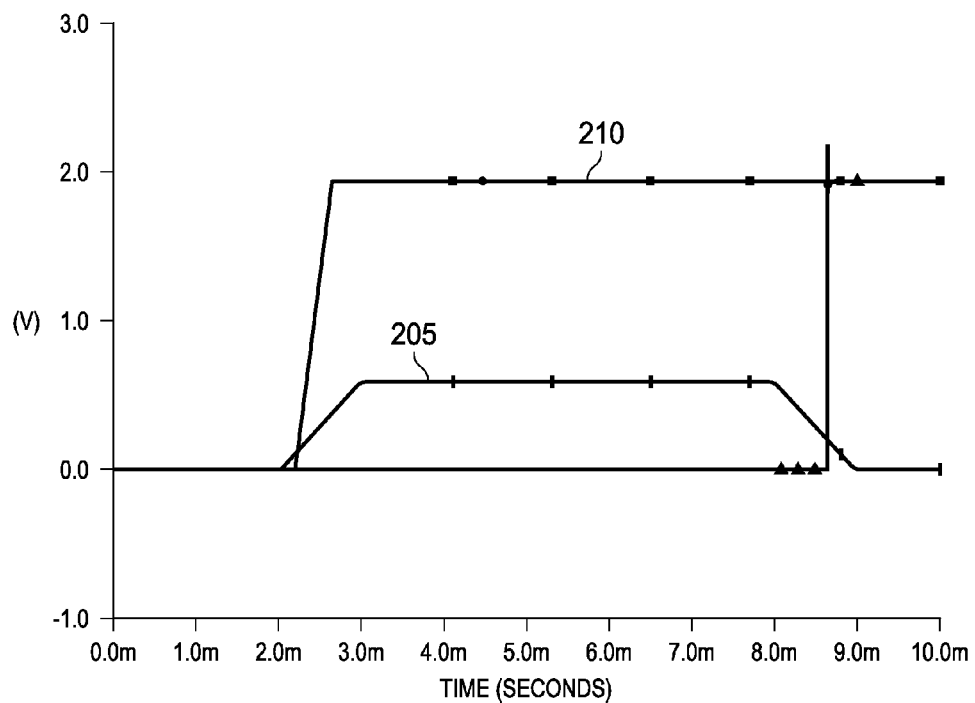
Figure 2B:
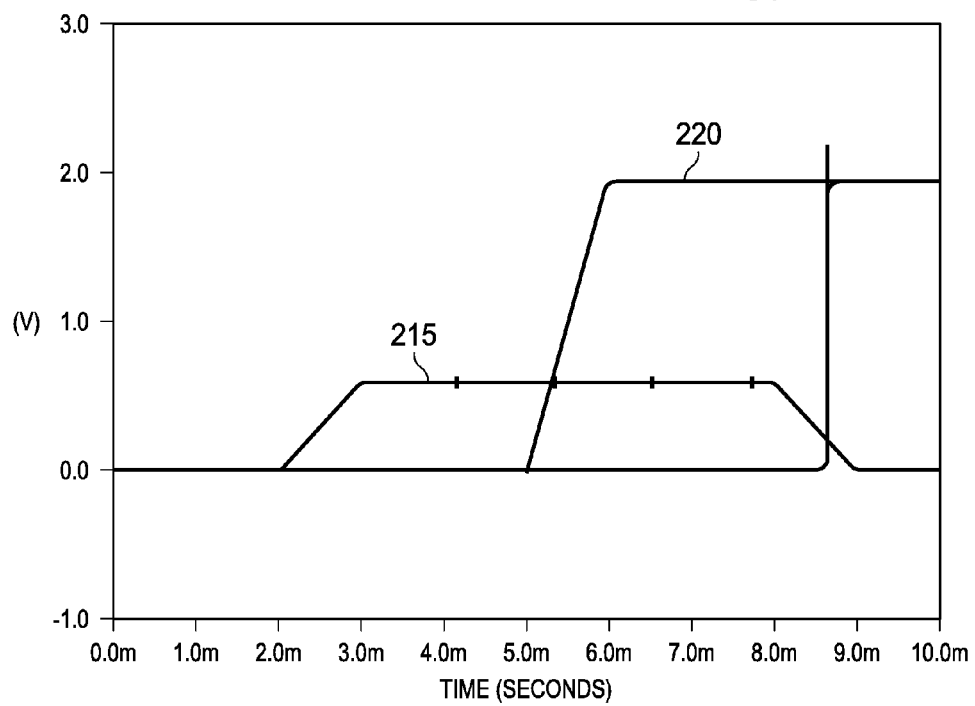

FIGS. 2A-2C are exemplary representations illustrating different power-up scenarios with respect to time, for the circuit 100. X axis represents variation in the time from 0.0 milli seconds (msec) to 10 msec. Y axis represents variation in power up of VDDC and VDDIO from −1.0 volts (V) to 3.0 V.

In FIG. 2A, a waveform 205 corresponds to the power up of VDDC and a waveform 210 corresponds to the power up of VDDIO at 0.0 V. Both VDDC and VDDIO are powered up together at 2.0 msec.

In FIG. 2B, a waveform 215 corresponds to the power up of VDDC at 0.0 V and a waveform 220 corresponds to the power up of VDDIO at 0.0 V. In this scenario, VDDC is powered up at 2.0 msec, followed by powering up of VDDIO at 5.0 msec.

In FIG. 2C, a waveform 225 corresponds to the power up of VDDC at 0.0 V and at 5.0 msec, and a waveform 230 corresponds to the power up of VDDIO at 0.0 V and at 2.0 msec. In this scenario, VDDIO is powered up at 2.0 msec, followed by powering up of VDDC at 5.0 msec.

The circuit 100 is hence not affected by the different power-up scenarios as a capacitor, for example the MOS capacitor 140, in the circuit 100 ensures that VDDZ0 receives appropriate voltage when VDDC is absent.

Figure 3:
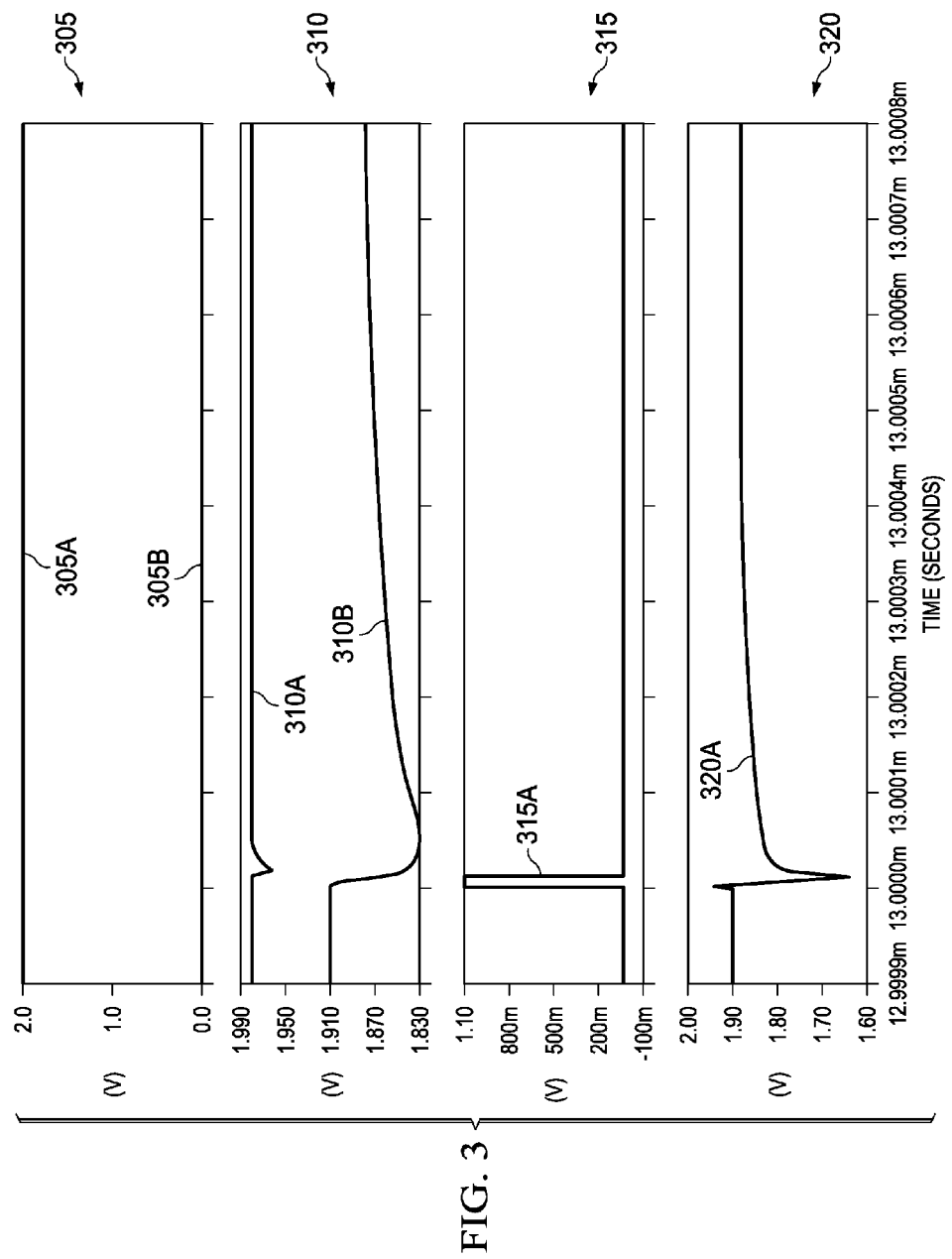
FIG. 3 is an exemplarily representation illustrating restoration of voltage discharge, in accordance with one embodiment.

FIG. 3 is an exemplarily representation illustrating restoration of voltage discharge. A graph 305 includes an X axis which represents variation in the time from 12.9999 msec to 13.0088 msec, and a Y axis that represents variation in voltages from 0.0 volts (V) to 2.0 V. A waveform 305A corresponds to the restoration of VDDIO at 2.0 V and a waveform 305B corresponds to the restoration of VDDC at 0.0 V.

A graph 310 includes an X axis which represents variation in the time from 12.9999 msec to 13.0088 msec, and a Y axis that represents variation in voltages from 1.830 V to 1.990 V. A waveform 310A corresponds to the restoration of VDD_OFF at 1.980 V and a waveform 310B corresponds to behaviour of the capacitor 340 at 1.910 V.

A graph 315 includes an X axis which represents variation in the time from 12.9999 msec to 13.0088 msec, and a Y axis that represents variation in voltages from −100 mV to 1.10 V. A waveform 315A corresponds to a voltage due to noise (VNOISE) at 0 V.

A graph 320 includes an X axis which represents variation in the time from 12.9999 msec to 13.0088 msec, and a Y axis that represents variation in voltages from 1.60 V to 2.00 V. A waveform 320A corresponds to the restoration of VDDZO at 1.90 V.

The graph 305, the graph 310, the graph, 315, and the graph 320 are used to check robustness of the sense logic circuit 120 and are obtained by applying a small pulse to the gate of the transistor 130A that connects VDDZ0 to VSS. A low spiked pulse is then obtained on VDDZ0 when VDDC is LOW and VDD_OFF is stabilized to logic level HIGH. The sense logic circuit 120 is activated when VDDZ0 dips below a certain level and VDDIO is restored.

FIG. 4 illustrates a method of detecting power supply. The detection of activation or inactivation of the power supply, for example a core power supply voltage (VDDC), can be performed using a power supply detection circuit, for example the circuit 100. The circuit 100 can be coupled between a core logic circuit and input and output (IO) circuit of an integrated circuit.

At step 405, a first output voltage (VDDZ0) is generated at a first node, for example the node 132, in response to VDDC. VDDZ0 is an inverted form of VDDC. VDDC at logic level LOW is an indication that the core logic circuit is inactivated or in sleep mode. VDDC at logic level HIGH is an indication that the core logic circuit is activated.

At step 410, a voltage drop associated with the first output voltage is sensed when the first output voltage is at a logic level HIGH. The voltage drop at the first node is sensed by a sense logic circuit, for example the sense logic circuit 320.

At step 415, voltage of the first output voltage is increased to an input and output power supply voltage in response to the voltage drop. The voltage of the first output voltage is increased using a current mirror circuit, for example the current mirror circuit 115. The current mirror circuit then provides a regenerative feedback for the first node by pulling up VDDZ0 to VDDC.

At step 420, the first output voltage is inverted to generate a second output voltage, for example VDD_OFF, at a second node. The first output voltage is inverted and buffered using an output circuit, for example the output circuit 125. VDD_OFF is at logic level HIGH which indicates that the core logic circuit is inactivated or in sleep mode. An IO power supply voltage (VDDIO) is hence inactivated to eliminate power dissipation at the IO circuit.

By using the power supply detection circuit in an integrated circuit, inactivation of VDDC can be detected and short circuit power dissipation can be eliminated at output drivers of the IO circuit. The power supply detection circuit can also be used for different VDDIOs, thereby optimizing power and performance.

In the foregoing discussion, the term "coupled" refers to either a direct electrical connection between the devices connected or an indirect connection through one or more passive or active intermediary devices. The term "circuit" means at least either a single component or a multiplicity of components, that are connected together to provide a desired function. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A power supply detection circuit comprising:
    an input circuit responsive to a core power supply voltage to generate a first output voltage at a first node;
    a sense logic circuit to sense a voltage drop associated with the first output voltage, when the first output voltage is at a logic level HIGH;
    a current mirror circuit responsive to the voltage drop to increase voltage of the first output voltage to an input and output power supply voltage; and
    an output circuit that inverts the first output voltage to generate a second output voltage at a second node;
    wherein the input circuit comprises:
        a first inverter to invert the core power supply voltage to generate the first output voltage; and
        a first p-type metal oxide semiconductor (PMOS) transistor in series connection with the first inverter to enable increase of the first output voltage to the core power supply voltage;
    wherein the sense logic circuit comprises:
        a second PMOS transistor responsive to the first output voltage to sense the voltage drop associated with the first output voltage; and
        a plurality of transistors, coupled to the second PMOS transistor, to enable sensing of the voltage drop;
    wherein the current mirror circuit comprises:
        a first n-type metal oxide semiconductor (NMOS) transistor, having a source coupled to the sense logic circuit, to control the current mirror circuit in response to the second output voltage;
        a second NMOS transistor, having a gate coupled to the first node, to provide an input to the current mirror circuit in response to the first output voltage; and
        a plurality of transistors, coupled to the first NMOS transistor and the second PMOS transistor, to increase the first output voltage to an input and output power supply voltage in response to the voltage drop.

2. The power supply detection circuit as claimed in claim 1, wherein the output circuit buffers the first output voltage if the first output voltage is at a logic level LOW.

3. The power supply detection circuit as claimed in claim 1, wherein the output circuit comprises:
    a second inverter, coupled to the first node, to invert the first output voltage;
    a third PMOS transistor, having a gate coupled to the second inverter, to generate the second output voltage; and
    a third NMOS transistor, having a drain coupled to a drain of the third PMOS transistor, to enable generation of the second output voltage.

4. The power supply detection circuit as claimed in claim 1 and further comprising:
    a MOS capacitor to charge the first node to the core power supply voltage;
    a fourth PMOS transistor, having a source coupled to the first node and a drain coupled to a gate of the MOS capacitor, to charge the MOS capacitor; and
    a pair of PMOS transistors in series connection with a gate of the fourth PMOS transistor, to enable charging of the MOS capacitor.

* * * * *